Figure 1:
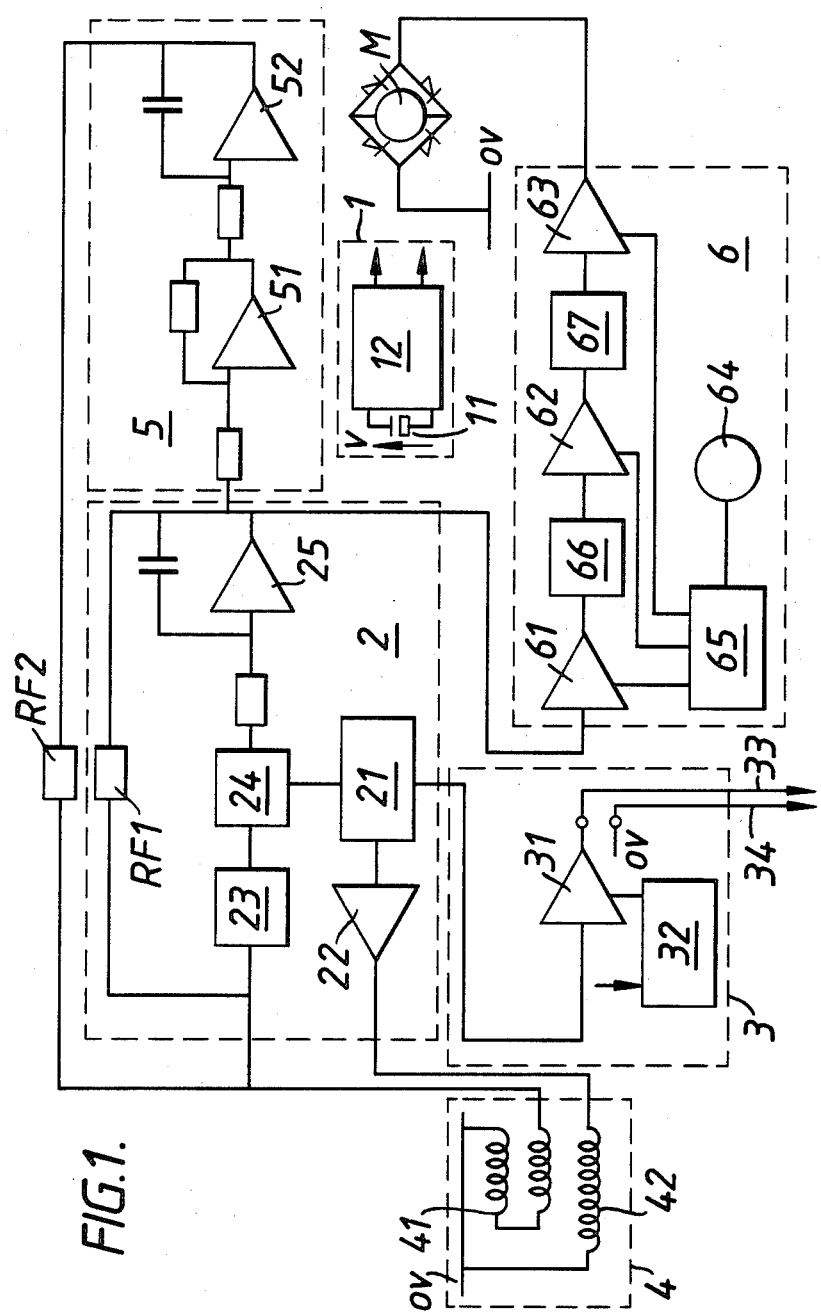

United States Patent [19]

Brown

[11] Patent Number: 4,725,778
[45] Date of Patent: Feb. 16, 1988

[54] DETECTING RESISTANCE FAULTS

[75] Inventor: Leonard Brown, Newcastle-upon-Tyne, England

[73] Assignee: British Gas Corporation, London, England

[21] Appl. No.: 788,029

[22] Filed: Oct. 16, 1985

[30] Foreign Application Priority Data

Oct. 30, 1984 [GB] United Kingdom ............... 8427358

[51] Int. Cl.[4] .................. G01V 3/11; G01N 27/82
[52] U.S. Cl. .................................. 324/263; 324/529; 324/559
[58] Field of Search ............... 324/218, 263, 529, 559

[56] References Cited

U.S. PATENT DOCUMENTS 2,479,219 8/1949 Drake .................................. 324/263
4,249,126 2/1981 McConell ........................... 324/529
4,475,078 10/1984 Itani .................................... 324/529

FOREIGN PATENT DOCUMENTS 1419354 12/1975 United Kingdom .
1447256 8/1976 United Kingdom .
1537870 1/1979 United Kingdom .
1602877 11/1981 United Kingdom .
2119094 11/1983 United Kingdom .

Primary Examiner—Reinhard J. Eisenzopf
Assistant Examiner—Jose M. Solis
Attorney, Agent, or Firm—Staas & Halsey

[57] ABSTRACT

Resistance faults, for example across insulating joints of cathodically protected pipelines may be evaluated by comparing magnetic field strengths associated with a test current of predetermined frequency flowing into and away from the joint.

5 Claims, 4 Drawing Figures

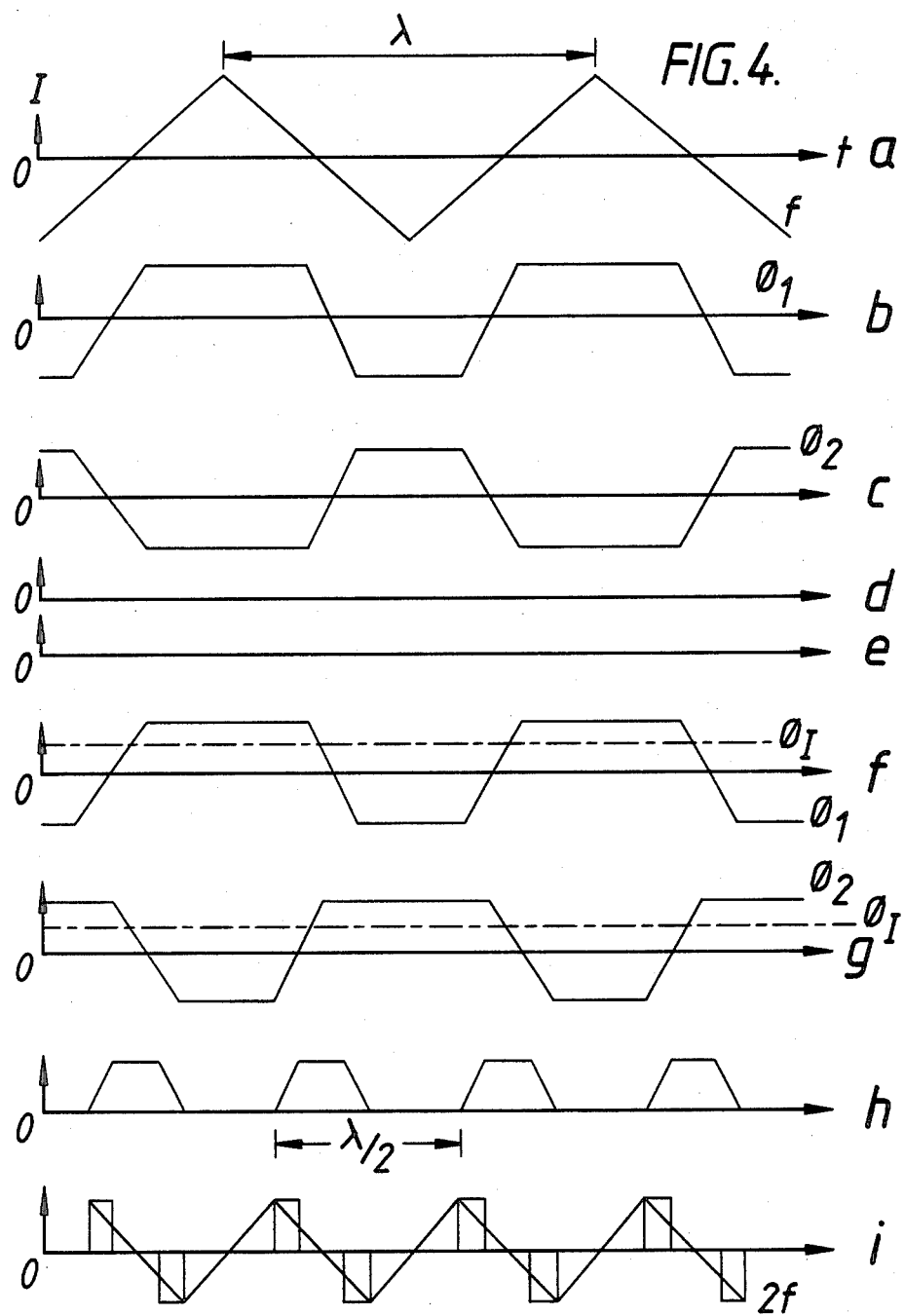

DETECTING RESISTANCE FAULTS

This invention relates to the detection and measurement of electrical current and, in particular, the detection and measurement of electrical current through electrically defective insulations.

It is known that pipelines made of ferrous materials have a tendency to corrode because of their intimate contact with wet substances such as the earth, as well as the fluids being transported. Techniques for reducing or eliminating corrosion include carcassing or coating the pipeline with an electrically insulating coating and applying direct current to the pipeline. This form of protection is known as cathodic protection (CP), the circuit being formed by direct impression of the current to the pipe and a return via leakage to earth via a sacrificial anode. Provided that there is no break down in the integrity of the pipeline coating it is theoretically possible to cathodically protect a whole pipeline from a single impression point. Earth leaks, through defects in the coating will detract from the efficiency of the cathodic protection.

It is becoming common practice to sectionalise the pipeline for CP purposes. Thus included in the pipeline or pipework structures are joints which are electrically separate points on the pipe run. A defect in one section will not adversely affect the adjacent or other sections.

In order for this CP system to work it is essential that the insulation properties of the joints be within predetermined limits and that the integrity of the joints be regularly and easily checked.

The present invention seeks to provide apparatus for detecting current leakages across resistive joints and a method for using such apparatus which is simple and intrinsically safe.

In accordance with the present invention there is provided apparatus for detecting electrical resistivity breakdown including means for applying an alternating current electric signal or test current of predetermined frequency separately to two electrical conductors connected together by a body having an unknown resistivity, movable transducer means adapted to be positioned in the regions of the conductors and the body and which is responsive to changes in the magnetic field associated with the flow of said test current and means for detecting and expressing said changes as data indicative of electrical resistance or conductivity.

The present invention also provides a method for determining electrical resistivity which includes the steps of applying an alternating current electric signal or test current of predetermined frequency separately to two electrical conductors connected together by a body having an unknown resistivity determining the magnetic field associated with the flow of said test current in at least one of the conductors in the region intermediate the body and the point at which said test current is applied and comparing that field with the field associated with the flow of said test current in a region of said one conductor more remote from said body than said intermediate region.

Although the apparatus and method of the invention may, in principle, be used for measuring the resistivity of insulations isolating two conductors, a preferred use is for checking the integrity of insulating joints used in pipeline systems, and particularly for pipes which have an impressed DC potential for cathodic protection purposes. Thus the frequency of the test current should be different from the 50 Hz which is usually the predominant pick-up current flow current, which is typically 50 Hz. The test current is preferably of lower frequency than the CP current and may be a pulse train of a frequency of 32 Hz. The wave-form may be of square or saw-tooth configuration. The use of low frequencies has the advantage that the test current can be detected (as its magnetic effect) even if the current is forced to flow within the pipe fabric due to non-conducting anomalies in the surface regions. Additionally a frequency of 32 Hz is sufficiently high to avoid transient magnetic changes caused by movements such as from traffic or in handling the transducer itself. It may also be desirable to provide the test signals at different currents for example a low current of 200 mA peak and a higher current of 3000 mA peak.

Additionally the present invention provides a method of field testing insulation between two conducting bodies subject to earth leakage which comprises connecting the bodies to a source of periodically varying test current, such source being part of a portable apparatus powered by battery means. The test current partly flows to earth through the conducting bodies and a small fault current flowing between the bodies may then be detected using a hand-held fluxgate probe connected to the portable apparatus. The test current has a frequency above a low range caused by movements of the probe and below the frequency of currents normally imposed on the conducting bodies. The hand-held probe provides an output representing the magnetic field associated with the fault current and such output is passed to integrator means in the portable apparatus which is tuned to response in a frequency band that has a significant Q-factor and a centre value equal to the frequency of the test current. In a more specific aspect of the invention, a method is provided wherein the output from the hand-held probe is fed to a high-gain magnetometer means before the integrator means and the fluxgate is compensated for unwanted static magnetic fields including the Earth's field by a charge taken on by the integrator means. Even more particularly, the invention provides a method wherein the output from the fluxgate is demodulated to base-band by the magnetometer means. In this particular aspect of the invention the fluxgate comprises a ferrous element in a nominally zero magnetic field under the action of a solenoid feed back loop defined by a first resistor and the integrator means produces additional feedback via a second resistor to transform a first order low-pass response of the magnetometer means into a second order band-pass response in said frequency band.

In another aspect of the method of the invention, the test current is driven by a voltage waveform obtained by direct switching of the battery supply without previous regulation. Additionally, the voltage waveform preferably comprises pulses, the width of which is increased as battery output voltage falls to keep the area of the pulses constant, thus keeping the test current substantially constant.

In a practical form the apparatus comprises an instrument case housing the circuitry for the square wave generator, circuitry for processing an imput signal and for expressing the signals as comprehensible data and power section, including, if necessary, batteries, for driving the other circuitry.

Figure 2:
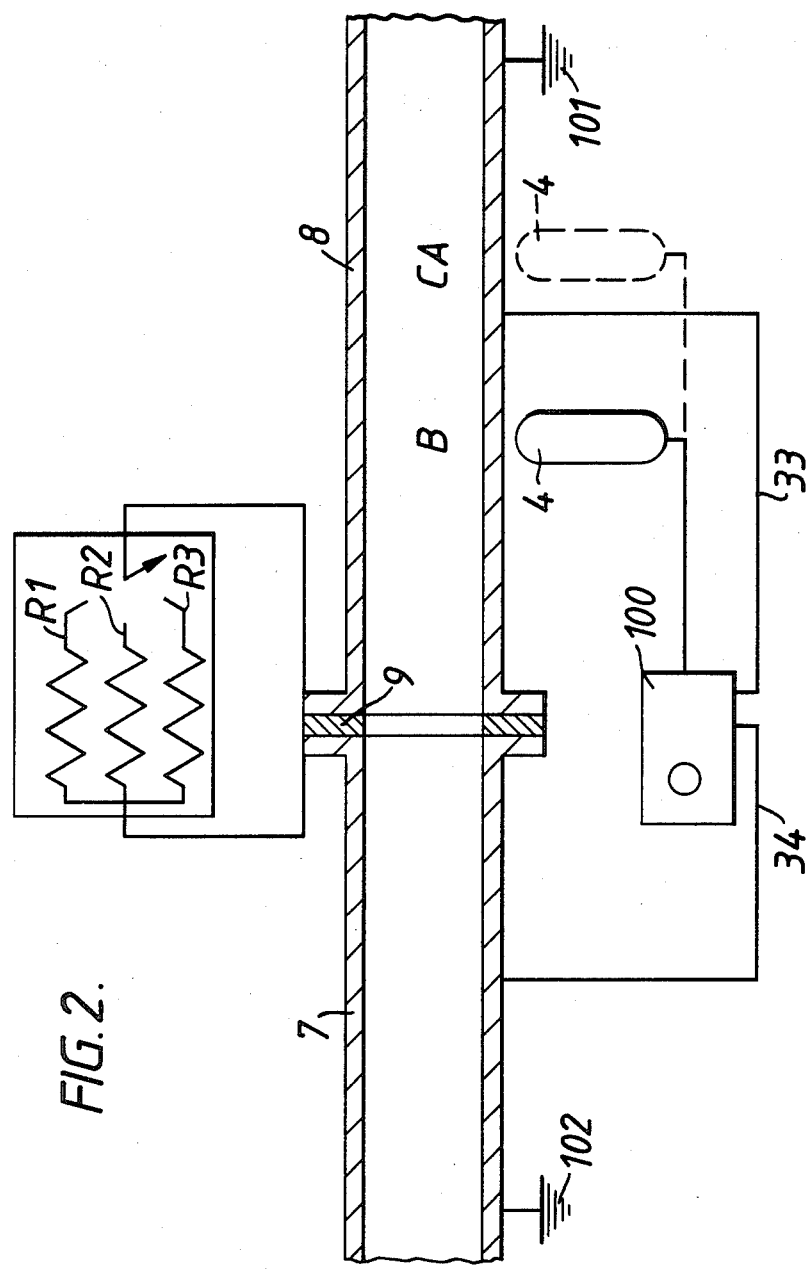
Figure 3:
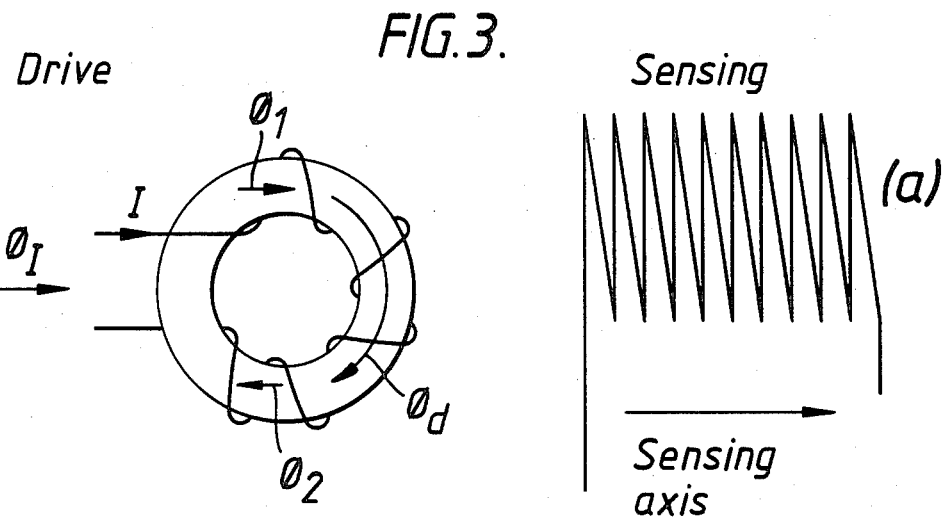
Figure 3:
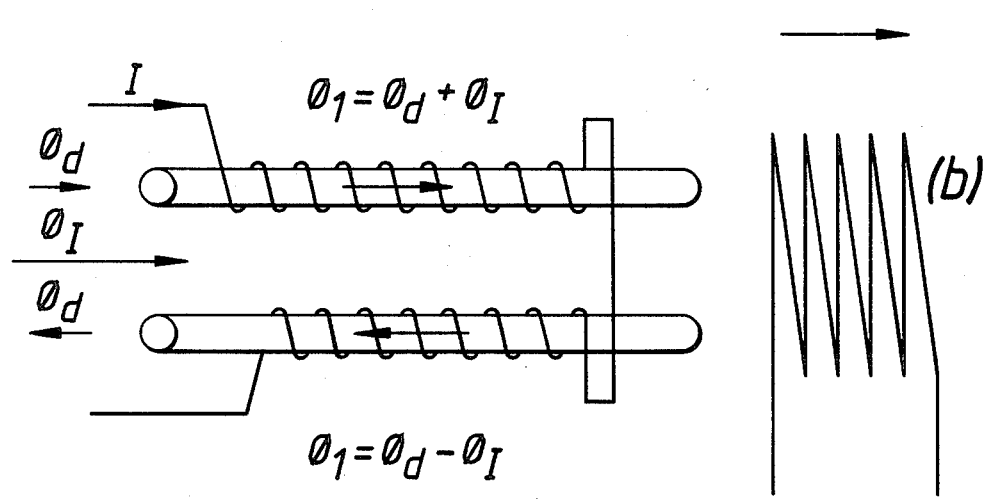

The invention will be further described with reference to the accompanying drawings in which:

FIG. 1 is a Block diagram of circuitry employed in the apparatus of the invention, FIG. 2 is a schematic representation of the apparatus of the invention coupled to a pipe section and associated insulation joint under test, FIG. 3 is a schematic representative of alternative forms of fluxgates, and FIG. 4 is a series of graphs illustrating waveforms for zero and non zero incident axial flux, Referring to FIG. 1, the circuitry consists of six modules or elements.

The power source is provided by batteries 11 in module 1 after suitable conversion and voltage regulation 12.

The test current of, say 32 Hz is generated by oscillator 21 located within the magnetometer module 2 and is fed an output stage 3 via a buffer amplifier 31 driven by a complitude control loop 32. The test current is applied to the pipe 7, 8 (FIG. 2) under test via wander leads 33, 34. The test current is defined by a variable pulse with voltage waveform devised by direct switching to the unregulated battery supply 11, and current limited by a series resistor. Switching from unregulated supply eliminates needs for high volume decoupling capacitors. The test current is regulated by increasing the pulse width as the battery voltage falls. This maintains constant pulse area and hence constant output voltage. Oscillator 21 provides the drive current of predetermined frequency and waveform, via operational amplifier 22 for the drive solenoid 41 of the field magnetometer probe 4.

The field magnetometer probe 4 is a hand-held transducer which senses changes in magnetic field. The construction and arrangement of transducer 4 is based on the principle of a second harmonic fluxgate magnetometer and comprises a pair of separate balanced coils connected in series opposition, which forms the drive solenoid 41, overlayed with a sense winding which forms the sensing coil on solenoid 42.

The drive solenoid may be either a pair of linear coils, wired in series opposition, as shown in FIG. 3b or a toroidally wound coil (FIG. 3a), which in effect represents two separate balanced coils connected in series opposition. The flux gate comprises a pair of primary drive coils or a toroidally wound core 41 and a secondary overlayed winding 42. The primary core or cores may be made of ferrous materials such as mumetal, and is driven into magnetic separation at a high audio frequency.

The signal produced in the sensory winding 42 of fluxgate 4 is demodulated to base-band by the circuitry 23, 24, 25 and RFI of the magnetometer module 2. This is a closed loop circuit in which the fluxgate core element is forced to sit in nominally zero field under the action of component RFI.

However, an additional feed back signal is produced from the integrater module 5 which is a plurality of series coupled operational amplifiers 51, 52 taking as the input signal the output of amplifier 25. The output signal from stage 52 is fed back to the input of 23 via component RF2. The function of module 5 is to transform the first order lowpass response of the magnetometer circuit 23, 24, 25 into a second order band pass response with a significant Q-factor and a centre frequency equal to the frequency of the output signal from oscillator 21. The integrator module enables the magnetometer module to be given high gain since the integrator module takes on a charge to compensate the fluxgate for unwanted static magnetic fields such as the incident Earth's field. Thus tuning of the magnetometer to a narrow band-width enables small alternating field measurements to be taken in the presence of high static magnetic fields. This confers the advantage of being able to minimise the need for post-amplification.

Signal from the output of amplifier 25 is processed in the gain/filter module 6 which applies additional switched gain and band pass filtering to the detected signal. Drift in centre frequency is minimised by using switched capacitor bandpass filter elements in which frequency control is defined by an $f_o \times 50$ control signal derived by a phase lock loop frequency multiplier from the test current signal eg. 32 Hz.

The output from the gain/filter module is demodulated and expressed as an analogue output, eg. as a meter display.

When the test current is applied to the conductor, the completion of the circuit will be through either an earth return or directly across the insulation body if its resistance has broken down. The flow of current will cause a change in the Earth's magnetic field in region of the conductor where the current is in flow. The change in magnetic field is directly proportional to the current flowing and thus proportional to the resistance of the circuit. By tightly tuning the magnetic sensor to the frequency of the test circuit, the sensors response will only be to changes in the test current. The sensor will not be sensitive to either movement within Earth's magnetic field (and thus it can be highly mobile) nor to changes reflected of the unavoidable 50 Hz pick-up current flowing in the pipeline.

Referring to FIG. 2, two sections of pipe 7, 8 are joined together but insulated by the insulating joint (IJ) 3. The test instrument comprises the housing 100 for the circuitry, output leads 33, 34, input lead 43 electrically connected to the magnetic sensor 4.

The output leads 33, 34 are placed into electrical contact with the pipes 7 and 8, respectively. The test current is then impressed on the pipes. The circuit is completed by the earth returns 101, 102. Thus for pipe 8 current will flow from the current injection point C to the earth coupon 101. The flowing current will create a change in the magnetic field strength which will be detected by the magnetic sensor 4 if it is positioned in the region of, say point A. The sensor is then moved to the region of point B. If the joint 9 is sound and there are no other earth leaks in that region, no current will flow and there will be no change in the magnetic flux. If, however, current flows because of an IJ fault resistance, a change in flux will occur.

For example, FIG. 4 illustrates the flux wave forms for a linear core fluxgate. Oscillator 21 produces a drive current of fundamental frequency f and wavelength λ. FIG. 4(a) is a plot of current vs time for the transverse waveform. The flux waveforms $\phi_1$ and $\phi_2$ for each of the linear cores 41 would be as shown in FIGS. 4(b) 4(c). The inbalance flux detected by the sense winding 42 would be as shown as FIG. 4(d). The resultant emf detected by differentiation of curve 4d according to the relationship:

$$e = -\frac{Nd\phi}{dt}$$

where $e$ = emf, $\phi$ = flux, $t$ = time)

would be 0, FIG. 4(e).

If the wave form of the cores is altered by an incident external axial flux $f$, the resultant waveforms for $\phi_1$ and $\phi_2$ would be as shown in FIGS. 4(f)4(g).

The interbalance flux detected by the sensing winding would be as shown in FIG. 4(h). The resultant emf as shown in FIG. 4(i) would have a wavelength of $\lambda/2$ and a fundamental frequency of $2f$ ie. the 2nd Harmonic.

Although the change in magnetic field strength is directly proportional to the current flowing, which is itself proportional to the internal resistance of the circuit, the value of reststivity of the IJ may not be directly determinable if there is an alternative resistance path such as an earth leak off the pipe.

However, for low resistance faults the direct comparison will hold true by applying the relationship:

$$Rx = RT(L+1)$$

where

Rx is the resistance of the IJ

RT is the total resistance of the alternative paths and RX is parallel.

L is the ratio of the current flow away from the IJ to that flowing into the IJ.

To determine the integrity of an IJ, a series of predetermined resistance faults are connected across the IJ, R1, R2 and R3 in FIG. 2. Thus, each resistance causes an increase of current into the IJ and changes in flux at Point B are noted as each resistance, R1 R2 R3 is switched in. With R2 (say 5 ohms) switched in there may be little or no change in flux and in that case if lower resistance R1 (say 1 ohm) is switched in and a change in flux is detected, then the joint is faulty. If a change in flux is detected with the 5 ohm resistance or a change occurs only when a higher resistance R3 (say 20 ohms) is switched in the joint can be considered to be sound.

I claim:

1. A method of field testing insulation between two conducting bodies subject to earth leakage comprising connecting said bodies to a source of periodically varying test current, said source being part of portable apparatus powered by battery means, which test current partly flows to earth through said bodies, and detecting a small fault current flowing between the bodies using a hand-held fluxgate probe connected to said apparatus, said test current having a frequency above a low range caused by movements of said probe and below the frequency of currents normally imposed on the conducting bodies, said probe providing an output representing the magnetic field associated with said fault current, said output being passed to integrator means in said apparatus tuned to respond in a frequency hand which has a significant Q-factor and which has a centre value equal to the frequency of said test current.

2. A method according to claim 1, said output from said probe being fed to a high-gain magnetometer means before said integrator means, said fluxgate being compensated for unwanted static magnetic fields including the Earth's field by a charge taken on by said integrator means.

3. A method according to claim 2, said output from said fluxgate being demodulated to base-band by said magnetometer means said fluxgate comprising a ferrous element in a nominally zero magnetic field under the action of a solenoid feed back loop defined by a first resistor, said integrator means producing additional feedback via a second resistor to transform a first order low-pass response of said magnetometer means into a second order band-pass response in said frequency band.

4. A method according to claim 1, said test current being driven by a voltage waveform obtained by direct switching of the battery supply without previous regulation.

5. A method according to claim 4, said voltage waveform comprising pulses with width of which is increased as battery output voltage falls to keep the area of said pulses constant, thus keeping said test current substantially constant.

* * * * *